United States Patent
Sasaki et al.

(10) Patent No.: US 8,025,759 B2
(45) Date of Patent: Sep. 27, 2011

(54) POLISHING APPARATUS AND POLISHING METHOD

(75) Inventors: Tatsuya Sasaki, Tokyo (JP); Naoshi Yamada, Tokyo (JP); Yoshifumi Katsumata, Tokyo (JP); Noburu Shimizu, Tokyo (JP); Seiryo Tsuno, Tokyo (JP); Takashi Mitsuya, Tokyo (JP)

(73) Assignee: Ebara Corporation, Tokyo (JP)

( * ) Notice: Subject to any disclaimer, the term of this patent is extended or adjusted under 35 U.S.C. 154(b) by 1063 days.

(21) Appl. No.: 10/559,815

(22) PCT Filed: Jul. 1, 2004

(86) PCT No.: PCT/JP2004/009681
§ 371 (c)(1),
(2), (4) Date: Mar. 23, 2006

(87) PCT Pub. No.: WO2005/004218
PCT Pub. Date: Jan. 13, 2005

(65) Prior Publication Data
US 2006/0166503 A1    Jul. 27, 2006

(30) Foreign Application Priority Data
Jul. 2, 2003 (JP) .................................. 2003-190300
Jun. 3, 2004 (JP) .................................. 2004-166202

(51) Int. Cl.
*H01L 21/304* (2006.01)
*B24B 37/04* (2006.01)
(52) U.S. Cl. .................. 156/345.13; 156/345.25; 216/89
(58) Field of Classification Search ............. 156/345.16, 156/345.25, 345.13; 216/89
See application file for complete search history.

(56) References Cited

U.S. PATENT DOCUMENTS

| | | | |
|---|---|---|---|
| 6,439,964 B1 | 8/2002 | Prahbu et al. |
| 6,517,412 B2 | 2/2003 | Lee et al. |
| 6,588,007 B1 | 7/2003 | Pasadyn et al. |
| 6,594,542 B1 | 7/2003 | Williams |
| 6,595,830 B1 | 7/2003 | Hewett et al. |
| 6,599,174 B1 | 7/2003 | Spikes, Jr. |
| 6,625,513 B1 | 9/2003 | Lymberopoulos et al. |

(Continued)

FOREIGN PATENT DOCUMENTS

JP    63-185574    8/1988

(Continued)

OTHER PUBLICATIONS

Supplementary European Search Report dated Jun. 25, 2009 issued in connection with European Application No. 04 74 7150 corresponding to the present application.

*Primary Examiner* — Sylvia R. MacArthur
(74) *Attorney, Agent, or Firm* — Wenderoth, Lind & Ponack, L.L.P.

(57) ABSTRACT

A polishing apparatus has a polishing section (302) configured to polish a substrate and a measurement section (307) configured to measure a thickness of a film formed on the substrate. The polishing apparatus also has an interface (310) configured to input a desired thickness of a film formed on a substrate to be polished and a storage device (308*a*) configured to store polishing rate data on at least one past substrate therein. The polishing apparatus includes an arithmetic unit (308*b*) operable to calculate a polishing rate and an optimal polishing time based on the polishing rate data and the desired thickness by using a weighted average method which weights the polishing rate data on a lately polished substrate.

19 Claims, 10 Drawing Sheets

U.S. PATENT DOCUMENTS

| | | |
|---|---|---|
| 6,746,958 B1 | 6/2004 | Hewett et al. |
| 6,751,518 B1 | 6/2004 | Sonderman et al. |
| 6,756,309 B1 | 6/2004 | Chen et al. |
| 2003/0077904 A1 | 4/2003 | Kakita |

FOREIGN PATENT DOCUMENTS

| | | |
|---|---|---|
| JP | 9-131663 | 5/1997 |
| JP | 10-106984 | 4/1998 |
| JP | 2003-124171 | 4/2003 |
| WO | 98/14306 | 4/1998 |

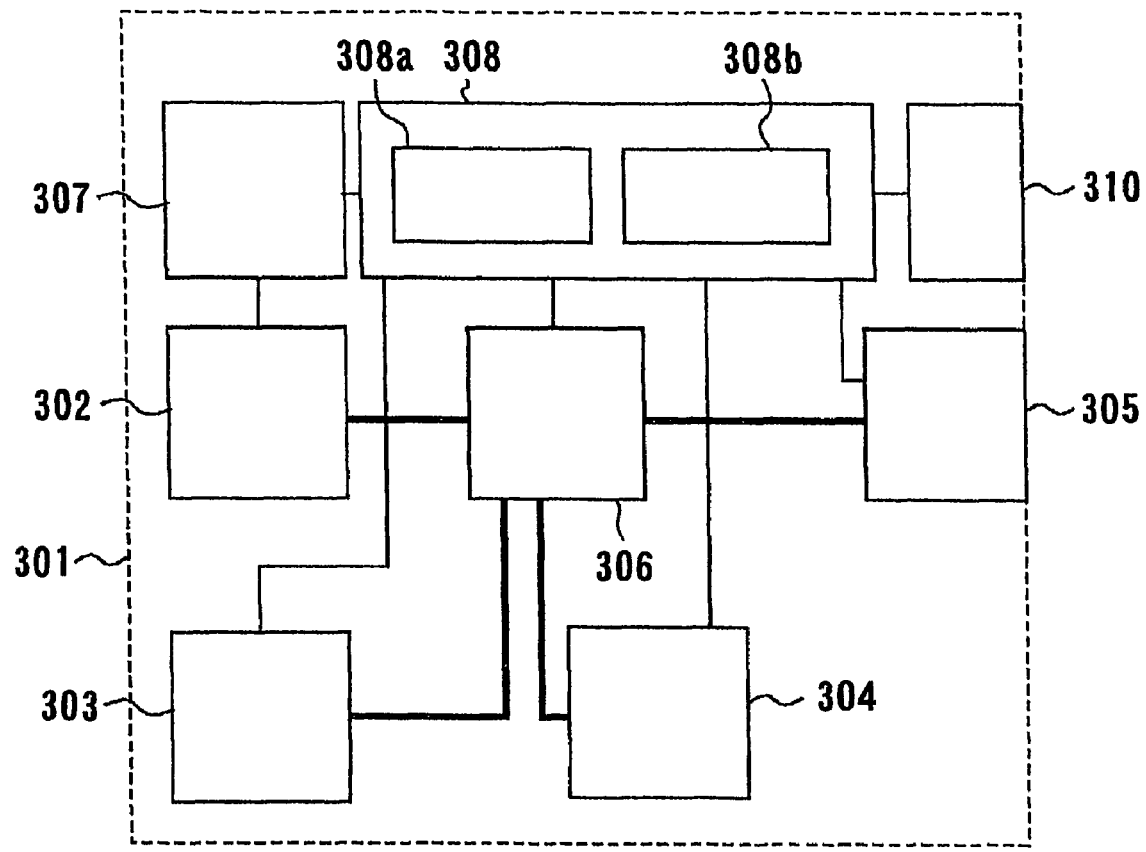
F I G. 3

POLISHING APPARATUS AND POLISHING METHOD

TECHNICAL FIELD

The present invention relates to a polishing apparatus and a polishing method, and more particularly to a polishing apparatus and a polishing method for polishing a substrate such as a semiconductor wafer to a flat mirror finish.

BACKGROUND ART

In recent years, semiconductor devices have become more integrated, and structures of semiconductor elements have become more complicated. Further, the number of layers in multilayer interconnects used for a logical system has increased. Accordingly, irregularities on a surface of a semiconductor device are increased, so that step heights on the surface of the semiconductor device tend to be large. This is because, in a manufacturing process of a semiconductor device, a thin film is formed on a semiconductor device, then micromachining processes, such as patterning or forming holes, are performed on the semiconductor device, and these processes are repeated to form subsequent thin films on the semiconductor device.

When the number of irregularities is increased on a surface of a semiconductor device, the following problems arise. When a thin film is formed on a semiconductor device, the thickness of the film formed at portions having a step is relatively small. Further, an open circuit may be caused by disconnection of interconnects, or a short circuit may be caused by insufficient insulation between interconnect layers. As a result, good products cannot be obtained, and the yield tends to be lowered. Further, even if a semiconductor device initially works normally, reliability of the semiconductor device is lowered after long-term use. At the time of exposure in a lithography process, if the irradiation surface has irregularities, then a lens unit in an exposure system is locally unfocused. Therefore, if the irregularities of the surface of the semiconductor device are increased, then it becomes problematically difficult to form a fine pattern itself on the semiconductor device.

Thus, in a manufacturing process of a semiconductor device, it becomes increasingly important to planarize a surface of the semiconductor device. The most important one of the planarizing technologies is chemical mechanical polishing (CMP). In the chemical mechanical polishing, with use of a polishing apparatus, while a polishing liquid containing abrasive particles such as silica ($SiO_2$) therein is supplied onto a polishing surface such as a polishing pad, a substrate such as a semiconductor wafer is brought into sliding contact with the polishing surface, so that the substrate is polished.

This type of polishing apparatus includes a polishing table having a polishing surface formed by a polishing pad, and a substrate holding device, which is referred to as a top ring or a carrier head, for holding a substrate such as a semiconductor wafer. When a semiconductor wafer is polished with such a polishing apparatus, the semiconductor wafer is held and pressed against the polishing table under a predetermined pressure by the substrate holding device. At that time, the polishing table and the substrate holding device are moved relative to each other to bring the semiconductor wafer into sliding contact with the polishing surface, so that the surface of the semiconductor wafer is polished to a flat mirror finish.

In the polishing apparatus, assuming that a polishing rate is constant, the amount of polishing is in proportion to a polishing time (processing time) during which a polishing process is performed. Accordingly, the following method is employed to determine a polishing time. First, the film thickness of one substrate is measured before a polishing process. Then, the substrate is polished for a predetermined period of time by a polishing apparatus. The film thickness of the semiconductor substrate is measured after the polishing process. Then, a polishing rate is calculated based on the reduced film thickness and the period of time of the polishing process. Subsequently, an optimal polishing time for subsequent substrates is calculated based on the calculated polishing rate and a desired film thickness. Thus, subsequent substrates are polished for the calculated optimal polishing time.

Since the polishing rate has variations, the calculated polishing rate may be adaptable to only the polished substrate. In such a case, if the polishing rate thus calculated is simply used for the purpose of calculation of an optimal polishing time for subsequent substrates, then the film thickness of the subsequent substrates may considerably deviate from a desired value after polishing processes. Accordingly, it has been proposed to store data on the amount of polishing and polishing times for polished substrates in a storage device, calculate an average polishing rate based on the data in the storage device, and perform a subsequent polishing process for a period calculated based on the average polishing rate. With this method of calculating an average polishing rate based on the past data, it is possible to save troublesome measurements of polishing rates for each lot of substrates and reduce variations of measurements.

However, in the polishing apparatus, a polishing rate largely depends upon surface conditions of a polishing pad, conditions of a pad conditioner for conditioning a surface of the polishing pad, a composition and temperature of a polishing liquid, a temperature and pressure of a deposition process, a non-uniformity of properties of films due to variations of materials, and variations in polishing temperature. Thus, a polishing rate is not necessarily maintained stable at an average polishing rate.

As described above, in recent years, chemical mechanical polishing (CMP) has been employed to planarize irregularities of a surface which are produced during formation of an insulating film or an interconnect metal film in a process for manufacturing semiconductor devices on a semiconductor substrate. In CMP, a substrate to be polished is pressed against a polishing pad formed of a non-woven fabric. The substrate and the polishing pad are moved relative to each other so as to bring the substrate and the polishing pad into sliding contact with each other while abrasive particles are supplied between the substrate and the polishing pad. Thus, the substrate is polished. Concentric grooves or checked grooves formed in a surface of the polishing pad can effectively supply a sufficient amount of abrasive particles to a central portion of the substrate.

A polishing pad having a two-layer structure in which a relatively hard polyurethane foam layer is attached to a relatively soft non-woven fabric is effective in reducing an influence due to nanotopology, i.e., swell of a surface of a substrate. A polishing pad having a two-layer layer structure, such as IC-1000/SUBA400 manufactured by Rodel Inc., is well known. In order to remove polishing wastes attached to a surface of the polishing pad during CMP, pad conditioning is conducted to remove a portion of the surface of the polishing pad with a diamond disk. As a result of the pad conditioning, a depth of the grooves formed in the surface of the polishing pad and a ratio of a soft layer and a hard layer change with time according to abrasion of the polishing pad, thereby exerting a great influence on the polishing process.

With a conventional polishing method, in order to monitor changes of a polishing rate and a within wafer uniformity of polishing according to a change of the polishing pad with time, a quality control (QC) substrate (substrate having a film all over a surface thereof) is polished each time a predetermined number of product substrates, on which semiconductor devices are formed, are polished. A polishing rate is defined as a thickness of a film removed per unit time when a film formed on a substrate is polished under a predetermined pressure (e.g. 1.5 psi). Processing time for product substrates to be subsequently polished is adjusted based on the polishing results of the QC substrate mostly by an operator. Specifically, the operator manually calculates an optimal polishing time based on the polishing results of the QC substrate. Further, it has heretofore been attempted to provide a film thickness measurement device in a polishing apparatus to optimize a processing time based on the measurement results. With this method, a certain period of time is required to perform a feedback control, so that several substrates may be polished without optimization of the processing time.

DISCLOSURE OF INVENTION

The present invention has been made in view of the above drawbacks. It is an object of the present invention to provide a polishing apparatus and a substrate polishing method which can polish a substrate with accuracy so as to have a desired film thickness, can prevent a manufacturing yield from being lowered by excessively polishing, and can prevent manufacturing cost from being increased by reworking processes.

A second object of the present invention is to provide a polishing method and a polishing apparatus which can properly control a polishing rate and polishing properties which would change due to a depth of a groove formed in a surface of a polishing pad, a thickness of a hard polishing pad, a state of a surface of a dressed polishing pad, or a temperature of a surface of a polishing pad, which can prevent reworking due to excessive polishing, and which can reduce a risk of a lowered yield.

In order to attain the first object, according to a first aspect of the present invention, there is provided a polishing apparatus having a polishing section configured to polish a substrate and a measurement section configured to measure a thickness of a film formed on the substrate. The polishing apparatus also has an interface configured to input a desired thickness of a film formed on a substrate to be polished and a storage device configured to store polishing rate data on at least one past substrate therein. The polishing apparatus includes an arithmetic unit operable to calculate a polishing rate and an optimal polishing time based on the polishing rate data and the desired thickness by using a weighted average method which weights the polishing rate data on a lately polished substrate.

Thus, an optimal polishing time is calculated by using a weighted average method which weights later polishing results before the calculation. Particularly, in a polishing apparatus employing chemical effects to polish a substrate, a polishing temperature has a great influence on a polishing rate. By weighting later data, it is possible to calculate an actual polishing rate at a high temperature with high accuracy. Since the weighted average method uses averaged data, a polishing rate can be calculated irrespective of variations of the data. Accordingly, an optimal polishing time can accurately be calculated so as to prevent excessive polishing and an increase of manufacturing cost due to reworking processes.

According to a second aspect of the present invention, there is provided a polishing apparatus having a polishing section configured to polish a substrate and a measurement section configured to measure a thickness of a film formed on the substrate. The polishing apparatus also has an interface configured to input a desired thickness of a film formed on a substrate to be polished and a storage device configured to store polishing rate data on at least one past substrate therein. The polishing apparatus includes an arithmetic unit operable to calculate a polishing rate and an optimal polishing time including a margin so as not to excessively polish a subsequent substrate based on the desired thickness and a range of a variation of the polishing rate data.

Thus, an optimal polishing time including a margin so as not to excessively polish a subsequent substrate is calculated based on a range of a variation of the polishing rate data. Accordingly, it is possible to prevent excessive polishing, which would directly cause a lowered yield and reworking.

According to a third aspect of the present invention, there is provided a polishing apparatus having a polishing section configured to polish a substrate and a measurement section configured to measure a thickness of a film formed on the substrate. The polishing apparatus also has an interface configured to input a desired thickness of a film formed on a substrate to be polished and a storage device configured to store polishing rate data on at least one past substrate therein. The polishing apparatus includes an arithmetic unit operable to calculate a polishing rate and an optimal polishing time based on the polishing rate data and the desired thickness. The polishing apparatus also includes a receiver configured to receive a calibration substrate having a known thickness of a film formed thereon and a transferring section configured to transfer the calibration substrate from the receiver to the measurement section.

Thus, a calibration substrate is held in the polishing apparatus and transferred to the measurement section at a predetermined frequency to calibrate the measurement section. Accordingly, it is possible to readily and stably maintain the accuracy of the measurement section, on which the film thickness measurement is based.

According to a fourth aspect of the present invention, there is provided a polishing apparatus having a polishing section configured to polish a substrate having a plurality of laminated films including an upper layer and a lower layer and a measurement section configured to measure a thickness of a film formed on the substrate. The polishing apparatus also has an interface configured to input a desired thickness of a film formed on a substrate to be polished. The polishing apparatus includes an arithmetic unit operable to calculate a polishing rate for at least one of the plurality of laminated films and an optimal polishing time for at least one of the plurality of laminated films based on the desired thickness and a ratio of polishing rates for the upper layer and the lower layer or on a signal from the measurement section.

According to a fifth aspect of the present invention, there is provided a method of polishing a substrate. In the polishing method, a thickness of a film formed on a substrate is measured. A desired thickness of a film formed on a substrate to be polished is inputted. Polishing rate data on at least one past substrate is stored in a storage device. A polishing rate and an optimal polishing time are calculated based on the polishing rate data and the desired thickness by using a weighted average method which weights the polishing rate data on a lately polished substrate. A subsequent substrate is polished for the optimal polishing time.

The measuring may be calibrated at a predetermined frequency with use of a calibration substrate having a known thickness of a film formed thereon.

According to a sixth aspect of the present invention, there is provided a method of polishing a substrate. In the polishing method, a thickness of a film formed on a substrate is measured. A desired thickness of a film formed on a substrate to be polished is inputted. Polishing rate data on at least one past substrate is stored in a storage device. A polishing rate and an optimal polishing time including a margin so as not to excessively polish a subsequent substrate are calculated based on the desired thickness and a range of a variation of the polishing rate data. The subsequent substrate is polished for the optimal polishing time.

After the optimal polishing time is calculated based on a polishing result of a first substrate in a lot, a subsequent substrate in the lot may be polished for the optimal polishing time.

In order to attain the second object, there are provided a polishing method and a polishing apparatus which can prevent a lowered yield due to excessive polishing and increased manufacturing cost due to reworking during polishing of a semiconductor substrate, and can optimize a polishing time to polish the semiconductor substrate so as to have a desired film thickness.

According to a seventh aspect of the present invention, there is provided a polishing apparatus having a polishing section configured to press a substrate against a polishing surface so as to bring the substrate into sliding contact with the polishing surface to polish the substrate. The polishing apparatus also has a first measurement device configured to measure a thickness of a film formed on the substrate, and a second measurement device configured to monitor at least one of parameters of a depth of a groove formed in a surface of the polishing surface, a roughness of the surface of the polishing surface, a temperature of the surface of the polishing surface, and a thickness of the polishing surface. The polishing apparatus includes a controller operable to calculate an optimal polishing time for the substrate based on a correlation between a change of a polishing rate and the at least one of parameters, a monitored value of the at least one of parameters, and measured values of the thickness of the film before and after polishing. A polishing rate is defined as a thickness of a film removed per unit time, and a polishing time is defined as a period of time required for polishing a substrate at a predetermined polishing rate.

The change of the polishing rate in the correlation may be defined as a change of a polishing rate until a new polishing surface is replaced. The first measurement device may comprise at least one of an optical sensor, an eddy-current sensor, and an optoacoustic sensor. These sensors may be provided below the polishing pad or inside of the polishing pad. The polishing section may have a dresser for conditioning the polishing surface, and the second measurement device may comprise a measurement device having a light source for applying light to a surface of composition of the dresser and a detector for detecting light reflected from the surface of the composition of the dresser to monitor the thickness of the polishing surface.

The second measurement device may comprise a detector for detecting an amount of abrasion of the polishing surface by using a laser and a subtracter for the amount of abrasion of the polishing surface from an initial depth of the groove of the polishing surface to calculate the depth of the groove of the polishing surface. The polishing apparatus may include a third measurement device for measuring at least two points on a polished substrate to detect irregularities of the polished substrate, and an alarm device operable to issue an alarm when an amount of the irregularities is more than a preset value. The polishing apparatus may include a cleaning liquid supply mechanism configured to supply a cleaning liquid that has been adjusted in temperature to the surface of the polishing surface. The polishing surface may be formed by a polishing pad or a fixed abrasive.

According to an eighth aspect of the present invention, there is provided a method of polishing a substrate. The method includes monitoring at least one of parameters of a depth of a groove formed in a surface of a polishing surface, a roughness of the surface of the polishing surface, a temperature of the surface of the polishing surface, and a thickness of the polishing surface. An optimal polishing time for a substrate is calculated based on a correlation between a polishing rate and the at least one of parameters. The substrate is pressed against the polishing surface so as to bring the substrate into sliding contact with the polishing surface to polish the substrate for the optimal polishing time.

A polishing rate is defined as a thickness of a film on a substrate removed per unit time when the substrate is polished while being pressed under a predetermined pressure. The polishing rate is calculated based on a difference between film thicknesses of a substrate to be polished and a polished substrate and on a polishing time. Further, an in-situ film thickness measurement device provided in the polishing table, i.e., a film thickness measurement device provided substantially in the polishing table, calculates a polishing rate per unit time. A polishing time is defined as a period of time required for polishing a substrate at a predetermined polishing rate.

A relationship between a polishing rate until a new polishing surface is replaced and the at least one of parameters may be recorded to obtain the correlation between the polishing rate and the at least one of parameters. Further, an approximation formula of a polynomial or a step function representing a correlation between the at least one of parameters and the polishing rate may be produced, and a monitored value of the at least one of parameters may be substituted for the approximation formula. In such a case, a more reliable correlation can be obtained, as the number of new polishing surfaces used for the relationship recorded is larger.

The roughness of the surface of the polishing surface may be represented by at least one of maximum peak height (Rb), maximum valley depth (Rv), maximum height (Rz), mean height (Rc), total height of profile (Rt), arithmetical mean roughness (Ra), root mean square height (Rq), skewness (Rsk), kurtosis (Rku), mean width (RSm), root mean square slope (R$\Delta$q), material ratio (Rmr(c)), profile section height difference (R$\delta$c), relative material ratio (Rmr), and ten-point mean roughness (Rzjis). Further, the roughness of the surface of the polishing surface may be measured by a contact-type surface roughness measurement device or a non-contact-type surface roughness measurement device.

The above and other objects, features, and advantages of the present invention will be apparent from the following description when taken in conjunction with the accompanying drawings which illustrate preferred embodiments of the present invention by way of example.

BRIEF DESCRIPTION OF DRAWINGS

FIG. 3 is a block diagram showing a control system of the polishing apparatus shown in FIG. 1;

DESCRIPTION OF THE INVENTION

Figure 1:
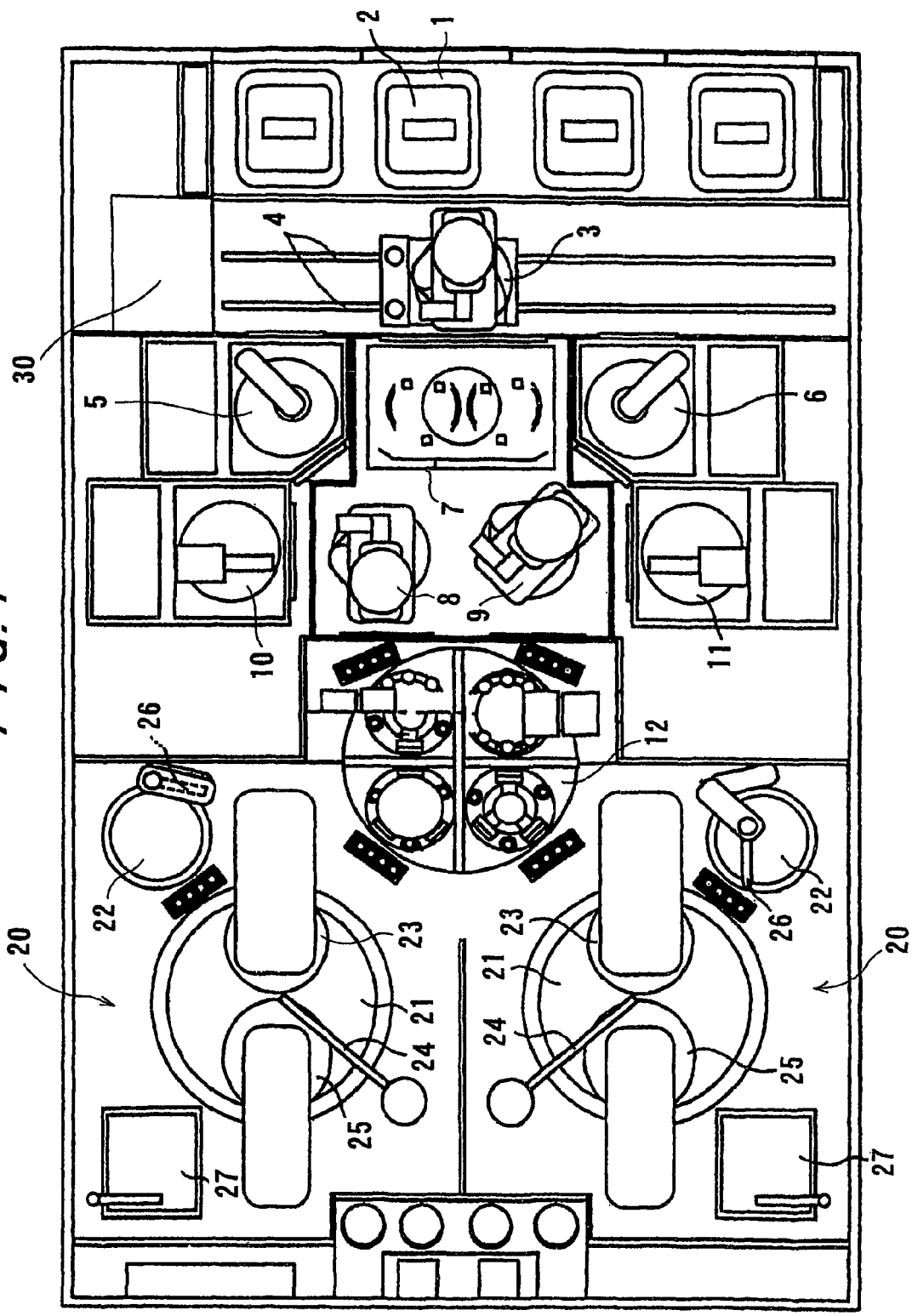
FIG. 1 is a plan view showing a whole arrangement of a polishing apparatus according to a first embodiment of the present invention.

A polishing apparatus according to embodiments of the present invention will be described below with reference to FIGS. 1 through 13B. Like or corresponding parts are denoted by like or corresponding reference numerals throughout drawings, and will not be described below repetitively FIG. 1 is a plan view showing a whole arrangement of a polishing apparatus according to a first embodiment of the present invention. As shown in FIG. 1, the polishing apparatus has four load/unload stages 1 each for receiving a cassette 2 which accommodates (or stocks) a plurality of substrates such as semiconductor wafers. The polishing apparatus also has a transfer robot 3 provided on rails 4 so that the transfer robot 3 can move along the rails 4 to access respective cassettes 2 at respective load/unload stages 1. The polishing apparatus also has two cleaning units 5 and 6 disposed at an opposite side of the rails 4 to the load/unload stages 1, and a substrate station 7 disposed between the two cleaning units 5 and 6 at a position accessible by the transfer robot 3. These cleaning units 5 and 6 are used for cleaning and drying a substrate after polishing. The cleaning units 5 and 6 are disposed at positions accessible by hands of the transfer robot 3.

The polishing apparatus includes a transfer robot 8 disposed at a position where hands of the transfer robot 8 can access the cleaning unit 5 and the substrate station 7, and a transfer robot 9 disposed at a position where hands of the transfer robot 9 can access the cleaning unit 6 and the substrate station 7. The polishing apparatus also includes a cleaning unit 10 disposed at a position adjacent to the cleaning unit 5 and a cleaning unit 11 disposed at a position adjacent to the cleaning unit 6. The cleaning unit 10 is accessible by the hands of the transfer robot 8, and the cleaning unit 11 is accessible by hands of the transfer robot 9. These cleaning units 10 and 11 are used for cleaning and drying a substrate after polishing.

The polishing apparatus has two polishing units 20 and 20. As shown in FIG. 1, each of the polishing units 20 and 20 has a polishing table 21 having a polishing surface thereon, a polishing table 22 having a polishing surface thereon, a top ring (substrate holding device) 23 for holding and pressing a substrate to be polished against the polishing surfaces on the polishing tables 21 and 22 to polish the substrate, a polishing liquid supply nozzle 24 for supplying a polishing liquid onto the polishing table 21, a dresser 25 for dressing the polishing surface of the polishing table 21, a dresser 26 for dressing the polishing table 22, and a cleaning tank 27 for cleaning the dresser 25. Thus, the polishing apparatus is designed so as to polish a plurality of substrates continuously, and is thus operable to perform a two-stage polishing process using two polishing tables. The polishing liquid supply nozzle 24 supplies a polishing liquid used for a polishing process and a dressing liquid (e.g. water) used for a dressing process onto the polishing table 21.

As shown in FIG. 1, the polishing apparatus also includes a rotary transporter 12 disposed between the polishing units 20 and the transfer robots 8 and 9. The rotary transporter 12 has four stages for placing substrates at equal angular intervals and can hold a plurality of substrates thereon at the same time.

The transfer robot 3 serves to take out one of substrates from the cassette 2 and return the substrate into the cassette 2. Substrates before polishing or after polishing are transferred between the cassette 2 and the rotary transporter 12 via the substrate station 7 and the transfer robots 8 and 9. The substrate placed on the rotary transporter 12 is held by the top ring 23 and moved to above the polishing table 21.

The polishing apparatus has an in-line film thickness measurement device 30 for measuring the film thickness of a substrate such as a semiconductor wafer, for example, a substrate that has been cleaned and dried after the polishing process. The film thickness measurement device 30 performs measurement before the transfer robot 3 returns a polished substrate to the cassette 2 or after the transfer robot 3 takes out a substrate from the cassette 2 before the polishing process. Further, each of the polishing units 20 has an in-situ film thickness measurement device 60 (see FIG. 2) provided in the polishing table 21 for measuring the film thickness of a substrate such as a semiconductor wafer during polishing. The film thickness measurement devices 30 and 60 may employ any one of or any proper combination of an eddy-current signal from a sensor coil, an optical signal of light emitted to and reflected from a surface of the substrate through an optical device, a temperature signal of a surface of the substrate, and a reflection signal of a microwave. Thus, the film thickness measurement devices 30 and 60 measure the film thickness of a conductive film such as a Cu film or an insulating film such as an oxide film formed on a substrate such as a semiconductor wafer.

The measurement results of these film thickness measurement devices 30 and 60 are transmitted to a controller 80 (see FIG. 2) and used for modification of operation conditions (recipe) of the polishing apparatus. Each of the film thickness measurement devices 30 and 60 measures the film thickness of a thick or thin film, e.g. a metal film or a non-metal film such as an oxide film, and detects a relative fluctuation of the film thickness. Thus, outputs from the film thickness measurement devices 30 and 60 are used, alone or in combination, to detect various conditions in the polishing process, e.g. an end point of the polishing process, in cooperation with certain conditions of respective polishing processes, such as rotational speeds of the polishing table 21 and the top ring 23 or a pressure of the top ring 23. These film thickness measurement devices 30 and 60 are configured to measure the thickness of a film in areas divided in a radial direction of the substrate. Pressing forces applied to the respective areas of the substrate by the top ring 23 are adjusted based on the measurement results of the film thickness in each area of the substrate. Thus, the polishing apparatus is adapted to monitor the output signals and the measurement results of the film thickness measurement devices 30 and 60 during polishing and/or after polishing to detect whether a conductive film is removed at any portion other than necessary portions such as interconnects or whether an insulating film is removed, to thereby determine an end point of the CMP process. Accordingly, the polishing apparatus can repeat appropriate polishing processes.

Figure 2:
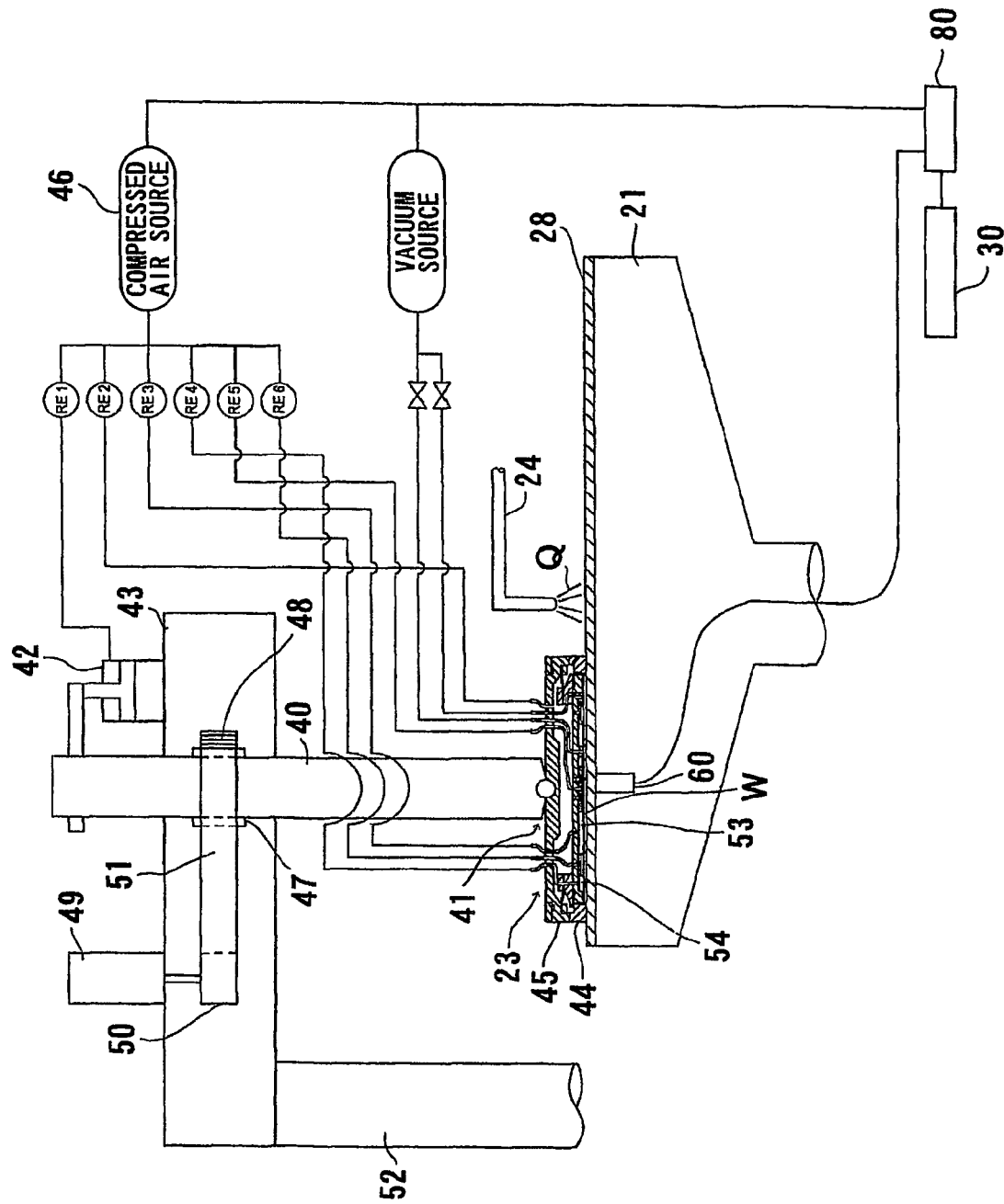
FIG. 2 is a cross-sectional view showing a portion of a polishing unit in the polishing apparatus shown in FIG. 1.

FIG. 2 is a cross-sectional view showing a portion of the polishing unit 20 shown in FIG. 1. The top ring (substrate holding device) 23 of the polishing apparatus serves to hold a substrate such as a semiconductor wafer to be polished and to press the substrate against each polishing surface on the polishing tables 21 and 22. As shown in FIG. 2, the polishing table 21 having a polishing pad (polishing cloth) 28 attached on an upper surface thereof is provided underneath the top ring 23. The polishing liquid supply nozzle 24 is provided above the polishing table 21 for supplying a polishing liquid Q onto the polishing pad 28 on the polishing table 21.

Various kinds of polishing pads are available on the market. For example, some of these are SUBA800, IC-1000, and IC-1000/SUBA400 (two-layer layer cloth) manufactured by Rodel Inc., and Surfin xxx-5 and Surfin 000 manufactured by Fujimi Inc. SUBA800, Surfin xxx-5, and Surfin 000 are nonwoven fabrics bonded by urethane resin, and IC-1000 is made of rigid foam polyurethane (single layer). Foam polyurethane is porous and has a large number of fine recesses or holes formed in its surface.

The top ring 23 is connected to a top ring drive shaft 40 by a universal joint 41, and the top ring drive shaft 40 is coupled to a top ring air cylinder 42 fixed to a top ring head 43. The top ring air cylinder 42 operates to move the top ring drive shaft 40 vertically to thereby lift and lower the top ring 23 as a whole and to press a retainer ring 44 fixed to a lower end of a top ring body 45 against the polishing table 21. The top ring air cylinder 42 is connected to a compressed air source 46 via a regulator RE1, which can regulate pressure of compressed air or the like which is supplied to the top ring air cylinder 42. Thus, it is possible to adjust a pressing force to press the polishing pad 28 with the retainer ring 44.

The top ring drive shaft 40 is connected to a rotary sleeve 47 by a key (not shown). The rotary sleeve 47 has a timing pulley 48 fixedly disposed at a peripheral portion thereof. A top ring motor 49 is fixed to the top ring head 43, and the timing pulley 48 is coupled to a timing pulley 50 mounted on the top ring motor 49 via a timing belt 51. Therefore, when the top ring motor 49 is energized for rotation, the rotary sleeve 47 and the top ring drive shaft 40 are rotated in unison with each other via the timing pulley 50, the timing belt 51, and the timing pulley 48 to thereby rotate the top ring 23. The top ring head 43 is supported on a top ring head shaft 52 fixedly supported on a frame (not shown).

For polishing a substrate such as a semiconductor wafer W, attraction of the semiconductor wafer W by suction portions of the top ring 23 is released, and the semiconductor wafer W is held on the lower surface of the top ring 23. Simultaneously, the top ring air cylinder 42 connected to the top ring drive shaft 40 is actuated to press the retainer ring 44 fixed to the lower end of the top ring 23 against the polishing surface on the polishing table 21 under a predetermined pressure. In such a state, pressurized fluids are respectively supplied to pressure chambers 53 and 54, a central pressure chamber, and an intermediate pressure chamber, which are formed on a lower surface of the top ring 23, under respective pressures, thereby pressing the semiconductor wafer W against the polishing surface on the polishing table 21. The polishing liquid supply nozzle 24 supplies a polishing liquid Q onto the polishing pad 28 in advance, so that the polishing liquid Q is held on the polishing pad 28. Thus, the semiconductor wafer W is polished by the polishing pad 28 with the polishing liquid Q being present between the (lower) surface, to be polished, of the semiconductor wafer W and the polishing pad 28.

In the present embodiment, a semiconductor wafer to be polished has a copper plated film deposited in trenches for interconnects which are formed in a $SiO_2$ film, and a barrier layer as an underlying material deposited beneath the copper plated film. When an insulating film such as a $SiO_2$ film is deposited as a top layer of the semiconductor wafer, the film thickness of the insulating film can be detected by an optical sensor or a microwave sensor. Such an optical sensor can utilize a light source of a halogen lamp, a xenon flash lamp, an LED, a laser light source, or the like. In order to remove a film such as an insulating film or a conductive film at unnecessary portions (portions other than interconnects) of the semiconductor wafer, the presence of the film is detected by various sensors. For example, an eddy-current sensor may be used as the film thickness measurement device 60 as shown in FIG. 2 to detect the thickness of a film to be polished, and the in-line film thickness measurement device 30 also measures the thickness of the film. The controller 80 controls a polishing process of the surface of the semiconductor wafer W based on the measurement results of the film thickness measurement devices 30 and 60.

FIG. 3 is a block diagram showing a control system of the polishing apparatus shown in FIG. 1. As shown in FIG. 3, the polishing apparatus 301 has a polishing section 302 including the polishing tables 21 for polishing a substrate and the top rings 23, a dressing section 303 including the dressers 25 for conditioning the polishing surface of the polishing table 21, a cleaning section 304 including the cleaning units 5, 6, 10, and 11, a loading/unloading section 305 for loading and unloading a semiconductor wafer in the cassette 2, and a transferring section 306 including the transfer robots 3, 8 and 9 and the rotary transporter 12. A substrate is taken out at the loading/unloading section 305 and transferred to the polishing section 302 or the cleaning section 304 by the transferring section 306.

The polishing apparatus 301 also has a film thickness measurement section 307 including the film thickness measurement devices 30 and 60 and a controlling section 308 including the controller 80. The film thickness of substrates before and after polishing and polishing times are stored in a storage device (storage area) 308a of the controlling section 308. The controlling section 308 includes an arithmetic unit 308b for calculating a polishing rate based on the amount of polished film on a substrate and a polishing time and storing the calculated polishing rate in the storage device 308a. Thus, in the polishing apparatus 301, the thickness of a removed film and polishing times are stored in the storage device 308a after each polishing process, and a polishing rate is calculated by the arithmetic unit 308b and stored in the storage device 308a. The polishing apparatus 301 includes an interface 310 for inputting and outputting various data communicated between an operator and the polishing apparatus 301.

Figure 4:
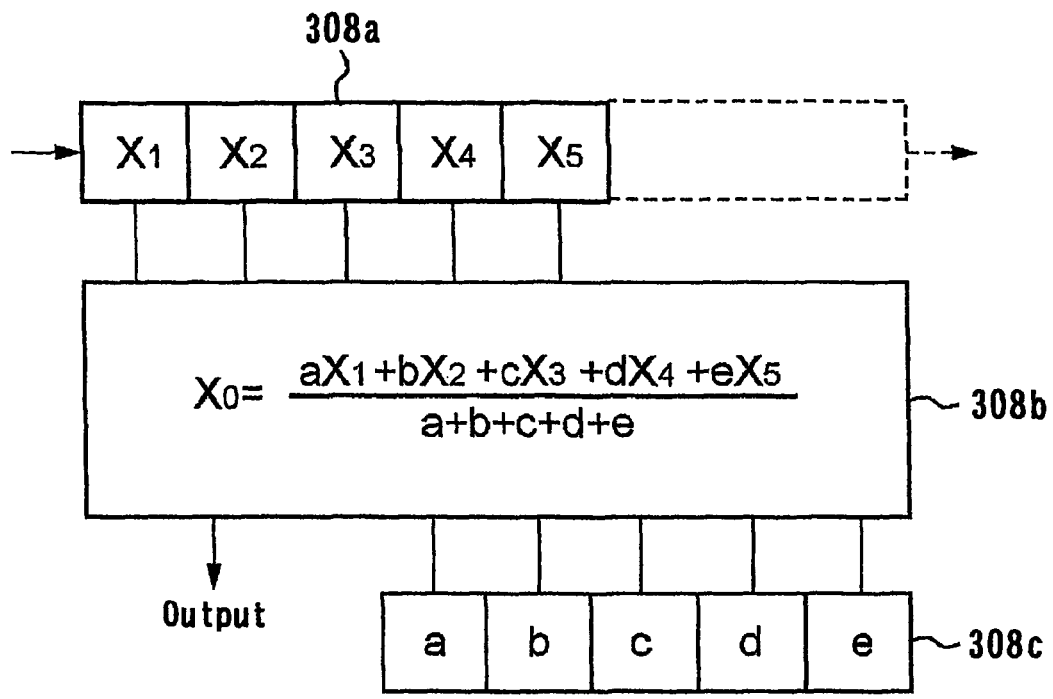
FIG. 4 is a block diagram showing an arithmetic unit using a weighted average method.

The arithmetic unit 308b can calculate a polishing rate by using a weighted average method. FIG. 4 shows an example of the arithmetic unit 308b. In the example shown in FIG. 4, polishing rate data $X_1$, $X_2$, $X_3$, $X_4$, $X_5$ . . . on past polished substrates are stored in the storage device 308a. Here, $X_1$ represents polishing rate data on the latest substrate, and $X_2$ represents polishing rate data on the second latest substrate. Thus, polishing data are arranged in order of the processes. Weight coefficients "a", "b", "c", "d", and "e" are stored in a weight data storage device 308c. Proper values are inputted as weight coefficients via the interface 310. The weight coefficient "a" is the largest value, and the weight coefficient "b" is smaller than the weight coefficient "a". The weight coefficient "c" is smaller than the weight coefficient "b", and the weight coefficient "d" is smaller than the weight coefficient "c". The weight coefficient "e" is the smallest value. For example, a=4, b=2, c=1, d=0.5, and e=0.25. Thus, a larger weight coefficient is set for a substrate which has been polished more lately.

As shown in FIG. 4, the following formula using a weighted average method is stored in the arithmetic unit 308b.

$$X_0 = \frac{aX_1 + bX_2 + cX_3 + dX_4 + eX_5}{a+b+c+d+e}$$

An example of the weighted average method will be described below. It is assumed that a polishing rate varies relatively drastically. For example, when five substrates are polished, there is assumed a case in which a polishing rate of the first wafer is 100 mm/min, that of the second one is 105 nm/min, that of the third one is 110 nm/min, that of the fourth one is 115 nm/min, and that of the fifth one is 120 nm/min.

An arithmetic average polishing rate is calculated by $$\frac{100+105+110+115+120}{5} = 110 [\text{nm/min}]$$

A weighted average polishing rate is calculated by $$\frac{a \times 100 + b \times 105 + c \times 110 + d \times 115 + e \times 120}{a+b+c+d+e}$$

As described above, in order to attach great importance to later results, a larger weight coefficient is set for a substrate which has been polished more lately. Accordingly, an average polishing rate using the weighted average method is calculated by $$\frac{0.25 \times 100 + 0.5 \times 105 + 1 \times 110 + 2 \times 115 + 4 \times 120}{0.25+0.5+1+2+4} = 115.8 [\text{nm/min}]$$

Thus, the weighted average method has good responsiveness to data just before the calculation.

In order to enhance the responsiveness, there is a method of calculating a polishing rate based on the latest substrate just before the calculation. With this method, the polishing rate may be calculated as follows.

100 mm/min for a first wafer
90 nm/min for a second wafer
110 nm/min for a third wafer
100 nm/min for a fourth wafer
90 nm/min for a fifth wafer
110 nm/min for a sixth wafer In this example, the polishing rate has variations within a range of ±10%.

In a case where a desired amount of polishing is 500 nm, if only polishing results of the latest substrate are used, polishing times are calculated as shown in Table 1 below.

TABLE 1

| Semiconductor wafer | First | Second | Third | Fourth |
|---|---|---|---|---|
| Polishing rate [nm/min] | 100 | 90 | 110 | 100 |
| Actual polishing time [min] | 5.0 | 5.6 | 4.6 | 5 |
| Calculated polishing time [min] | — | 5.0 | 5.6 | 4.6 |
| Deviation of polishing amount | | +54 | −110 | +40 |

Thus, if the polishing rate varies in a short period, then a difference between an actual polishing amount and an optimal polishing amount may be increased.

With the weighted average method, it is possible to obtain high responsiveness to variations of a polishing rate, which continue for a long term, such as continuously increasing variations, and simultaneously to perform a robust control which can flexibly absorb short-term variations. Particularly, a relationship between a polishing rate and a temperature is represented by the Arrhenius equation $$k = A \times \exp(-Ea/RT)$$

where k is the rate of reaction, A is a constant, R is the gas constant, Ea is the activation energy, and T is the absolute temperature.

Thus, an increase of the polishing temperature may cause an abnormal increase of the polishing rate. The average polishing rate calculated by the weighted average method can effectively contribute to accurate calculation of optimal polishing times.

There will be described a method employed when substrates are processed in each lot. In this case, the controlling section 308 calculates an optimal polishing time including a margin (clearance or tolerance) so as not to excessively polish a subsequent substrate, based on a range of variations of a past polishing rate. Specifically, when a plurality of substrates are processed in a lot, an optimal polishing time including a margin so as not to excessively polish a substrate is calculated based on an initial film thickness, a desired film thickness, and a range of variations of a past polishing rate. Then, at least the first substrate in the lot is polished for the calculated optimal polishing time.

For example, a range of variations of a past polishing rate means variations of a polishing rate in or between at least several past lots. There are also variations within a surface of one substrate. However, a polishing rate is calculated based on an average of measurement results at a plurality of points on a surface of a substrate. When the polishing rate for a subsequent substrate is calculated based on the past data, the margin serves to prevent the subsequent substrate from being excessively polished.

For example, a margin for a first substrate may be calculated by either one of (the amount of polishing)/(the average polishing rate×120%), (the amount of polishing)/(the maximum polishing rate in the past), or (the amount of polishing× 80%)/(the average polishing rate).

In an actual operation, the first substrate in a lot should carefully be polished particularly in the following cases.
1) A case where a polishing pad or a conditioner is replaced
2) A case where an expendable member such as a top ring is replaced
3) A case where a polishing apparatus is interrupted (idled) between a previous lot and a subsequent lot Under these circumstances, the temperature of the polishing pad may change to cause a change of a polishing rate.

The polishing apparatus has a receiver (not shown) for receiving a calibration substrate, which has a known film thickness. The film thickness measurement devices 30 and 60 are calibrated with the use of the calibration substrate at a predetermined frequency, for example, once a week or once a day. Since the film thickness measurement devices 30 and 60 are required to perform measurement of the film thickness with high accuracy, it is necessary to inspect and calibrate the film thickness measurement devices 30 and 60 routinely.

When the film thickness measurement devices 30 and 60 comprise a light interference film thickness measurement unit or a spectroscopic Ericsson film thickness unit having a light source typified by a tungsten halogen lamp, the quantity of light is reduced as the lamp nears the end of its life. Accordingly, when the quantity of light is reduced, calibration is required to maintain measurement accuracy (signal to noise ratio) by lengthening an exposure time (integral time) during the measurement. Conventionally, such troublesome inspection and calibration are conducted mainly by an operator. As described above, the polishing apparatus in the present embodiment has a calibration substrate therein to conduct calibration in response to commands from the controlling section 308. Accordingly, the film thickness of substrates can readily be measured with high accuracy.

There will be described a polishing process for a two-layer film composed of an upper layer of a TaN film and a lower layer of an $SiO_2$ film. In this example, the controlling section 308 can calculate a polishing rate for at least one of a plurality of laminated thin films or polishing rates for each of the laminated thin films, based on a ratio of polishing rates for the upper and lower layers or on signals from the film thickness measurement device 60, which is provided in a polishing mechanism. A polishing time is optimized based on the calculated polishing rates.

Figures 5A, 5B:
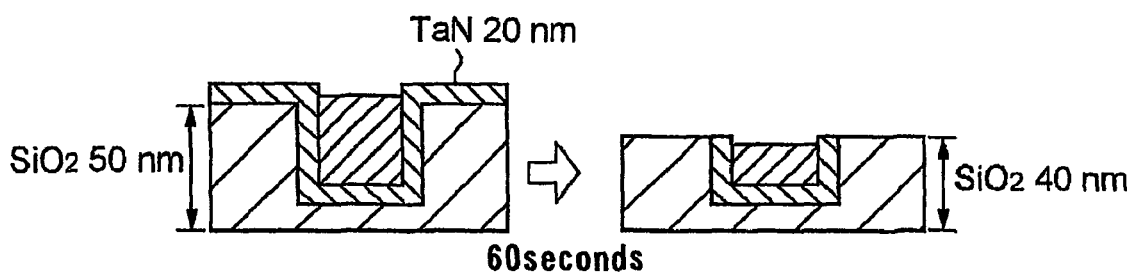
FIGS. 5A and 5B are cross-sectional views showing a change of a film thickness of a two-layer film.

For example, as shown in FIG. 5A, a two-layer film is composed of a lower layer of an $SiO_2$ film having a thickness of 50 nm and an upper layer of a TaN film having a thickness of 20 nm. Then, as shown in FIG. 5B, a TaN film of 20 nm and a $SiO_2$ film of 10 nm are removed by a polishing process for 60 seconds. In this case, if polishing rates for the $SiO_2$ film and the TaN film are not known, then it is difficult to calculate an optimal polishing time to reduce the film thickness of the $SiO_2$ film to 35 nm.

When a ratio of the polishing rates of the TaN film and the $SiO_2$ film is 2:1, the polishing rate for the $SiO_2$ film can be calculated by $$\frac{x \div \frac{2(TaN)}{1(SiO_2)} + y}{t} [nm/sec]$$

where x [nm] is the thickness of the removed TaN film, y [nm] is the thickness f the removed $SiO_2$ film, and t [sec] is the polishing time.

In the above example, the thickness x of the removed TaN film is 20 nm, the thickness y of the removed $SiO_2$ film is 50-40 nm, and the polishing time t is 60 seconds. Accordingly, the polishing rate for the $SiO_2$ film is calculated by $$\frac{20 \div \frac{2(TaN)}{1(SiO_2)} + (50-40)}{60} = 0.33 [nm/sec]$$

Thus, an additional polishing time required to polish the $SiO_2$ film so as to have a film thickness of 35 nm is calculated by (40−35)/0.33=15 seconds.

Figures 6A, 6B:
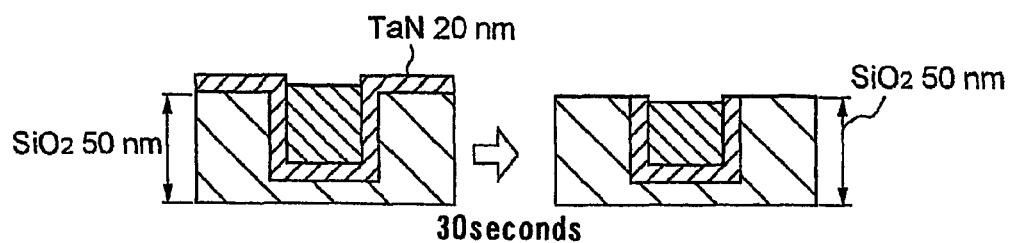
FIGS. 6A through 6C are cross-sectional views showing a change of a film thickness of another two-layer film.
Figure 6C:
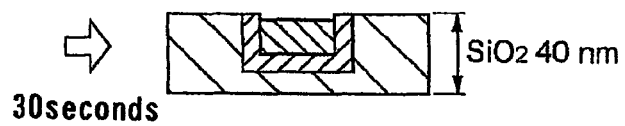

There will be described an example in which an end point for the TaN film is detected by the in-situ film thickness measurement device 60 such as an eddy-current sensor or an optical sensor, which can measure the film thickness of a substrate during polishing. As shown in FIG. 6A, a two-layer film is composed of a lower layer of an $SiO_2$ film having a thickness of 50 nm and an upper layer of a TaN film having a thickness of 20 nm. It is assumed that the in-situ film thickness measurement device 60 detects an end point of a barrier metal (TaN film) after polishing of 30 seconds as shown in FIG. 6B. Thus, completion of the polishing of the TaN film is detected by the in-situ film thickness measurement device 60 after polishing of 30 seconds. Accordingly, a polishing rate of the TaN film is calculated by (20 nm/30 sec)=0.66 nm/sec. At that time, the $SiO_2$ film has a thickness of 50 nm. Since the ratio of the polishing rates of these two films is 2:1, a polishing rate for the $SiO_2$ film is calculated as 0.33 nm/sec. Accordingly, when the substrate is further polished for 30 seconds, the $SiO_2$ film can have a desired film thickness as shown in FIG. 6C.

Further, if a polishing time for the TaN film can be obtained at the end point of polishing, then an optimal polishing time can be calculated without use of a selectivity (a ratio of the polishing rates). For example, when the end point detection by the in-situ film thickness measurement device 60 indicates that it takes and 30 seconds to remove a TaN film of 20 nm and 60 seconds to polish and remove the TaN film of 20 nm and an $SiO_2$ film of 10 nm, an polishing rate for the $SiO_2$ film is calculated by (50−40)/(60−30)=0.33 nm/sec because it takes (60−30) seconds to polishing the $SiO_2$ film from 50 nm to 40 nm. Accordingly, if a desired film thickness of the $SiO_2$ film is 35 nm, then an additional polishing time is calculated by (40−35)/0.33=15 seconds.

Figures 7A, 7B:
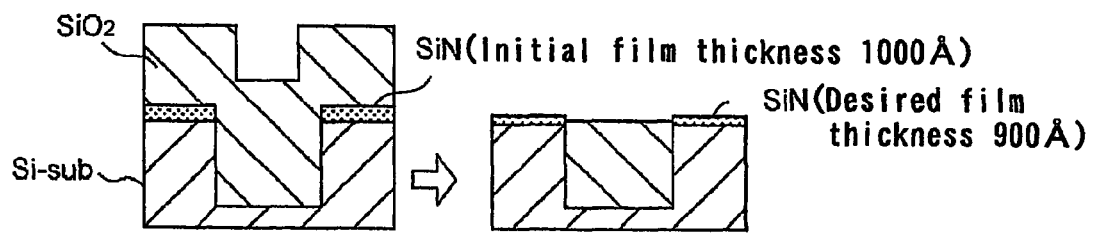
FIGS. 7A and 7B is cross-sectional views showing a change of a film thickness of another two-layer film.

Furthermore, as shown in FIGS. 7A and 7B, in a case where an etching groove is formed in a silicon substrate with an SiN film used as a mask and an $SiO_2$ film is deposited on a surface of the substrate including the etching groove, if an end point of polishing the $SiO_2$ film on the SiN film is detected, then a polishing time required for a desired film thickness of the SiN film can be calculated based on a ratio of polishing rates of the $SiO_2$ film and the SiN film and an output of the film thickness measurement device 60. Thus, as shown in FIG. 7B, it is possible to form a (shallow trench isolation) structure having the $SiO_2$ film embedded in the groove formed in the silicon substrate and a planarized surface under accurate control of the film thickness.

As described above, according to the present invention, a polishing rate of a film formed on a substrate is accurately calculated so as to perform accurate control of the thickness of the film.

Figure 8:
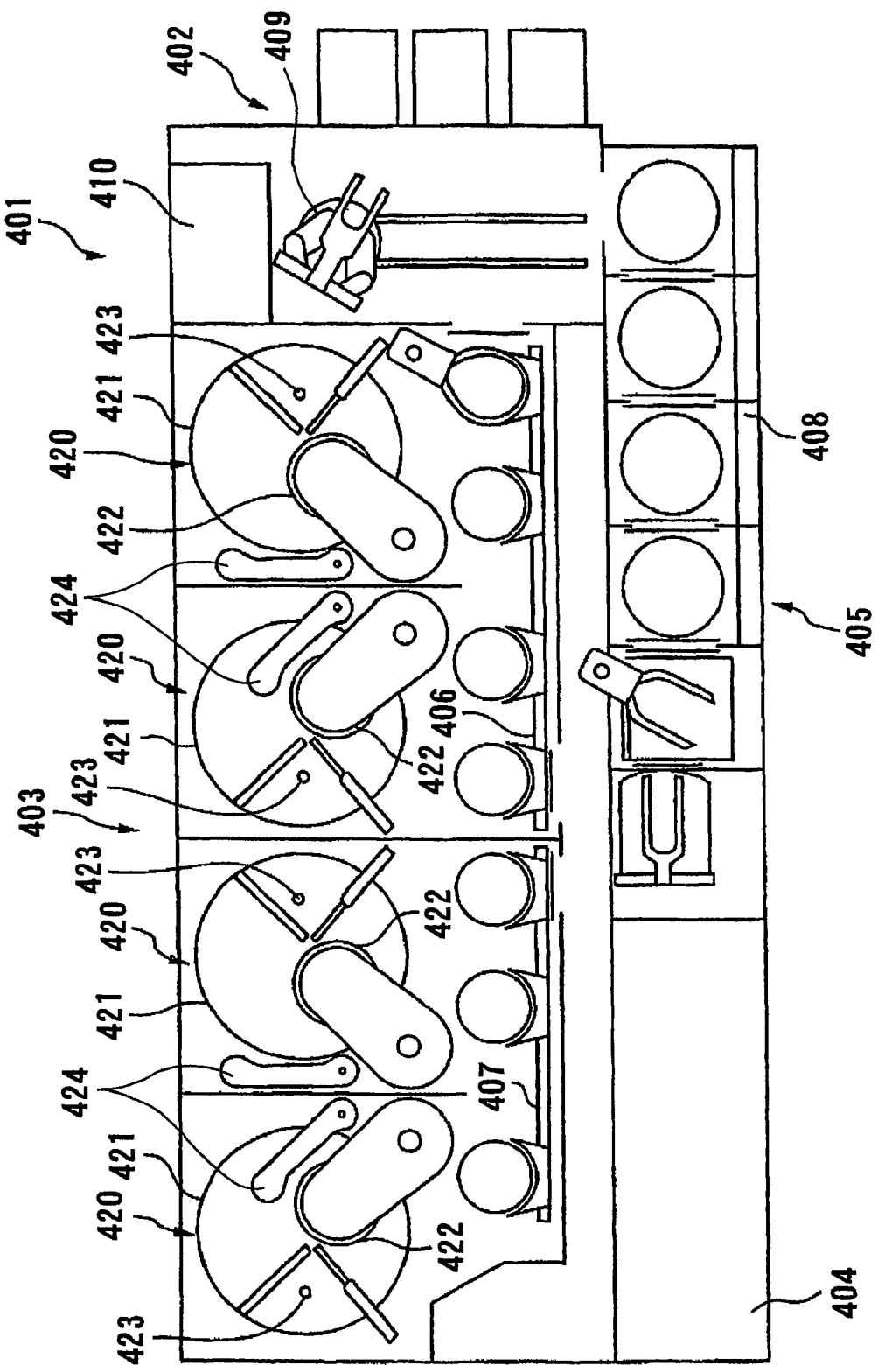
FIG. 8 is a plan view showing a whole arrangement of a polishing apparatus according to a second embodiment of the present invention.

FIG. 8 is a plan view showing a whole arrangement of a polishing apparatus according to a second embodiment of the present invention. As shown in FIG. 8, the polishing apparatus 401 has a loading/unloading section 402, a polishing section 403, a controller 404, a cleaning section 405, an in-line film thickness measurement device 410, and a transferring section including two linear transporters 406 and 407, a transfer unit 408, and a transfer robot 409. The polishing section 403 includes four polishing units 420. Each of the polishing units 420 includes a polishing table 421, a top ring 422, an in-situ film thickness measurement device 423 provided in the polishing table 421, and a dresser 424. The in-line film thickness measurement device 410 is located substantially outside of the polishing tables 421.

Figure 9:
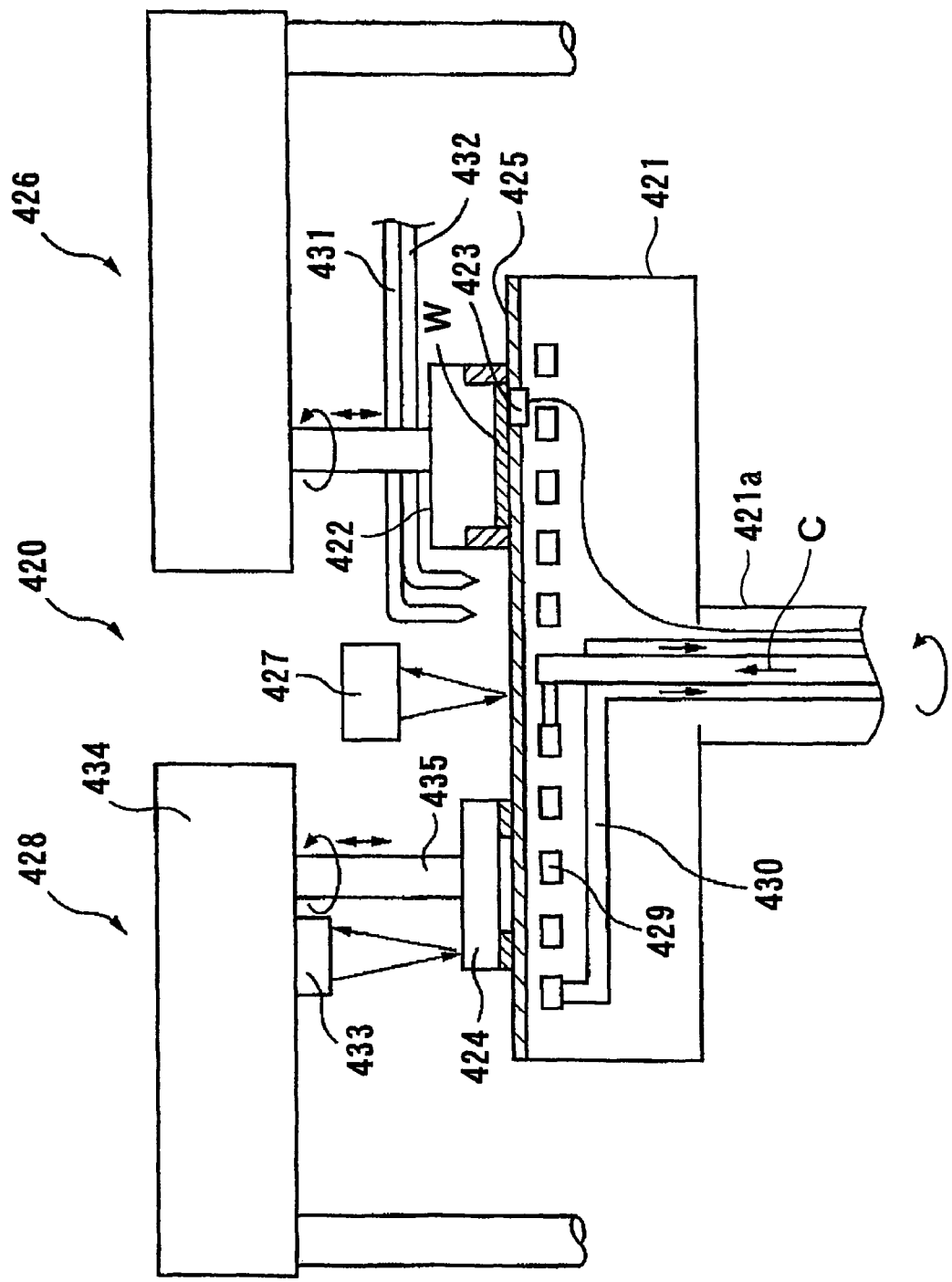
FIG. 9 is a cross-sectional view showing a portion of a polishing unit in the polishing apparatus shown in FIG. 8.

FIG. 9 is a cross-sectional view showing a portion of the polishing unit 420 shown in FIG. 8. Each of the other polishing units 420 has the same structure. The polishing unit 420 has the polishing table (turntable) 421 having a polishing surface (polishing pad) 425 thereon, a top ring unit 426 including the top ring 422 for holding and pressing a substrate W to be polished against the polishing pad 425, the in-situ film thickness measurement device 423 for measuring the thickness of a film formed on the substrate W, and a pad condition measurement device 427 for measuring the roughness and the temperature of the polishing pad 425 and the depth of grooves formed in the polishing pad 425. The polishing unit 420 includes a dressing unit 428 for regenerating (conditioning) the polishing pad 425, a passage 429 provided in the polishing table 421 for conducting a fluid C for temperature adjustment to a portion below the polishing pad 425, communication pipes 430 connected to the passage 429 for circulating the fluid C through a rotatable shaft 421a of the polishing table 421, a polishing liquid supply passage 431 for supplying a polishing liquid onto the polishing pad 425, a cleaning liquid supply passage 432 for supplying a cleaning liquid onto the polishing pad 425, and a pad thickness measurement device 433.

The dressing unit 428 has the dresser 424 for dressing the polishing pad 425, a dresser swing arm 434 for swinging the dresser 424 on the polishing pad 425, and a dresser shaft 435 mechanically connecting the dresser 424 and the dresser swing arm 434 to each other. The dresser shaft 435 is rotated so as to rotate the dresser 424. The dresser shaft 435 presses the dresser 424 against the polishing pad 425 so as to bring the dresser 424 into sliding contact with the polishing pad 425.

Figure 10:
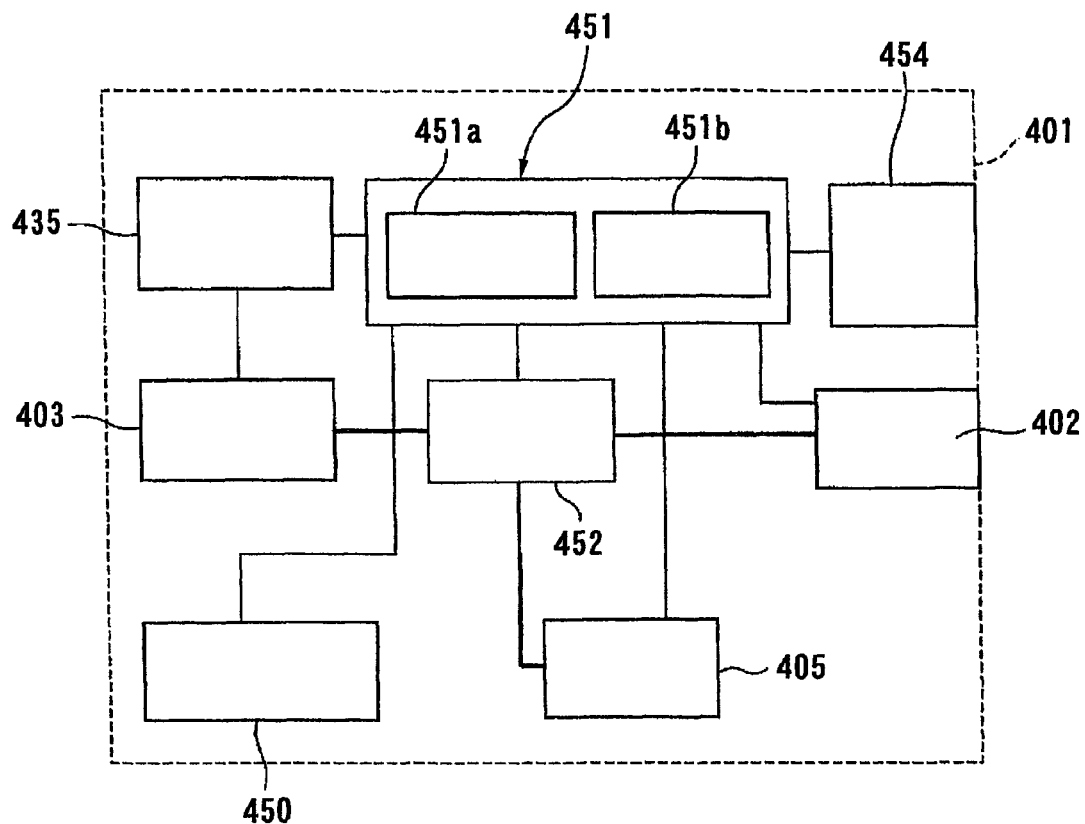
FIG. 10 is a block diagram showing a control system of the polishing apparatus shown in FIG. 8.

FIG. 10 is a block diagram showing a control system of the polishing apparatus shown in FIG. 8. As shown in FIG. 10, the polishing apparatus 401 has the polishing section 403 including the polishing tables 421 for polishing a substrate and the top rings 422, a dressing section 450 including the dressing units 428 for conditioning the polishing pad 425 on the polishing table 421, the cleaning section 405 for cleaning and drying a polished substrate, the loading/unloading section 402, a controlling section 451 including the controller 404, a transferring section 452 including the linear transporters 406 and 407, the transfer unit 408, and the transfer robot 409, and a film thickness measurement section 453 including the measurement devices 410, 427, and 433.

A substrate is taken out from a cassette (not shown) in the loading/unloading section 402 and transferred to the in-line film thickness measurement device 410 by the transfer robot 409. The in-line film thickness measurement device 410 measures the film thickness of the substrate before polishing. After the measurement in the in-line film thickness measurement device 410, the substrate is transferred to the polishing section 403. When the in-situ film thickness measurement devices are provided in the polishing tables 421 in the polishing section 403, the film thickness of the substrate is measured by the in-situ film thickness measurement device during polishing. After polishing, the substrate is subjected to a cleaning process and a drying process in the cleaning section 405. Then, the substrate is preferably transferred to the in-line film thickness measurement device 410 by the transfer robot 409, so that the film thickness of the substrate is measured after polishing.

During operation, the film thickness measurement section 453 transmits data on the film thickness of the substrate before, during, and after polishing to the controlling section 451. Such data can be stored in a storage device 451a of the controlling section 451. The controlling section 451 has an arithmetic unit 451b for calculating an optimal polishing time. The arithmetic unit 451b calculates a polishing rate based on the amount of polishing a film and a polishing time by using a weighted average method as described in the first embodiment, for example, when the film thickness measurement devices comprise an optical sensor. The calculated polishing rate is stored in the storage device 451a. Accordingly, each time a substrate is polished by the polishing apparatus 401, the thickness of a removed film and a polishing time are stored in the storage device 451a, and a polishing rate is calculated by the arithmetic unit 451b. The calculated polishing rate is stored again in the storage device 451a. Further, various data are inputted and outputted through an interface 454 between an operator and the controller 404. For example, the operator inputs a desired thickness of a film to be polished through the interface 454. The desired film thickness is stored in the storage device 451a of the controlling section 451.

As described above, the controlling section 451 of the polishing apparatus 401 includes the storage device 451a and the arithmetic unit 451b. The storage device 451a stores data in time series on changes of a polishing rate until a new polishing pad is replaced, the roughness and the temperature of the polishing pad, the depth of the grooves formed in the surface of the polishing pad, and the thickness of the polishing pad. The controlling section 451 creates a database in the storage device 451a based on the above data. A polishing rate is defined as a thickness of a film removed per unit time when a film formed on a substrate is polished under a predetermined pressure (e.g. 1.5 psi). The polishing rate is calculated based on an actual polishing time and a difference between the film thickness of a substrate before polishing and the film thickness of the substrate after polishing. Further, a polishing rate per unit time may be calculated by using the in-situ film thickness measurement devices 423 provided in the polishing tables 421.

There will be described a method of calculating an optimal polishing time for a substrate to be polished. First, before a substrate is transferred to the polishing section 403, the film thickness of the substrate is measured. The depth of the grooves formed in the surface of the polishing pad 425, the roughness and the temperature of the surface of the polishing pad 425, and the thickness of the polishing pad 425 are measured by respective sensors provided in the polishing section 403. Measured values are transmitted to the arithmetic unit 451b. In the arithmetic unit 451b, data nearest the measured values are obtained from the database stored in the storage device 451b. Thus, an approximate polishing rate is obtained. Then, an optimal polishing time is calculated based on the approximate polishing rate.

Further, when the film thickness measurement device 423 is provided in the polishing table 421, the following method may be employed. First, a polishing rate is calculated based on measured values of the depth of the grooves formed in the surface of the polishing pad 425, the roughness and the temperature of the surface of the polishing pad 425, and the thickness of the polishing pad 425. After the thickness of the film on the substrate is measured by the film thickness measurement device 423 when the substrate is brought into contact with the polishing pad 425, the arithmetic unit 451b may calculate an optimal polishing time based on a relationship between the polishing rate and the film thickness.

The temperature of the surface of the polishing pad 425 as one of the parameters can be set at a desired value by supplying a cleaning liquid such as pure water which has been adjusted in temperature from the cleaning liquid supply passage 432 (see FIG. 9) between polishing processes. Further, the temperature of the surface of the polishing pad can be set at a desired value by a temperature adjustment mechanism including the temperature adjustment passage and communication pipes. The temperature adjustment mechanism can perform the temperature adjustment at desired timing during a polishing process or between polishing processes.

Figure 11A:
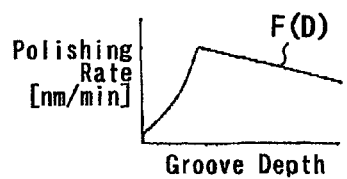
FIGS. 11A through 11D are graphs showing approximation formulas indicating qualitative relationships between respective parameters and a polishing rate.
Figure 11B:
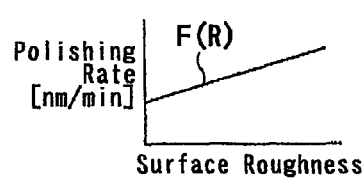
Figure 11C:
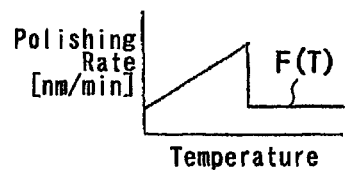
Figure 11D:
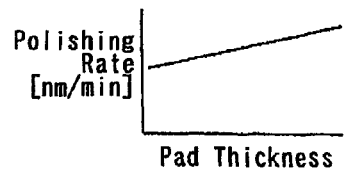

FIGS. 11A through 11D are graphs showing approximation formulas indicating qualitative relationships between respective parameters and a polishing rate. The relationships between the respective parameters (the depth of the grooves formed in the surface of the polishing pad, the roughness and the temperature of the surface of the polishing pad, and the thickness of the polishing pad) and a polishing rate are represented by functions including variables of these parameters on a five-dimensional space. The relationships between the respective parameters and a polishing rate may be represented by an approximation formula of a polynomial or a step function. These parameters have the qualitative relationships to the polishing rate as shown in FIGS. 11A through 11D. FIG. 11A is a graph showing an approximated relationship between the depth of the grooves formed in the surface of the polishing pad and the polishing rate. FIG. 11B is a graph showing an approximated relationship between the surface roughness of the surface of the polishing pad and the polishing rate. FIG. 11C is a graph showing an approximated relationship between the temperature of the surface of the polishing pad and the polishing rate. FIG. 11D is a graph showing an approximated relationship between the thickness of the polishing pad and the polishing rate.

Thus, the polishing apparatus in the present embodiment has a polishing section configured to press a substrate against a polishing pad so as to bring the substrate into sliding contact with the polishing pad to polish the substrate, a first measurement device configured to measure a thickness of a film formed on the substrate, and a second measurement device configured to monitor at least one of parameters of a depth of a groove formed in a surface of the polishing pad, a roughness of the surface of the polishing pad, a temperature of the surface of the polishing pad, and a thickness of the polishing pad. The polishing apparatus includes a controller operable to calculate an optimal polishing time for a substrate based on a correlation between a change of a polishing rate and the parameter, a measured value of the parameter, and measured values of the thickness of the film before polishing and after polishing.

In the film thickness measurement after the polishing process, if insufficient polishing is detected, then a remaining film thickness is transmitted to the arithmetic unit 451b to modify the polishing rate that was used as a parameter and the polishing rate in the database stored in the storage device 451a. Accordingly, the approximation formulas including respective parameters are also modified. If excessive polishing is detected, the polishing rate is also modified in the same manner as described above. When a polishing rate per unit time which is calculated based on the data on the film thickness measured by the in-situ film thickness measurement device 423 provided in the polishing table 421 is different from the polishing rate that was used as a parameter, the arithmetic unit 451b and the storage device 451a perform in cooperation with each other in the same manner as described above to modify the data.

In the polishing apparatus of the present embodiment, the film thickness measurement devices for measuring the thickness of the film formed on the substrate can comprise an optical sensor, an eddy-current sensor, or an optoacoustic sensor, which is provided below the polishing pad or inside of the polishing unit. The pad thickness measurement device 433 for measuring the thickness of the polishing pad 425 may comprise a light source for applying laser light to a surface of a fixed portion of the dresser 424 when the dresser 424 is conditioning the surface of the polishing pad 425, and a detector for detecting laser light reflected from the surface of the fixed portion of the dresser 424, as shown in FIG. 9.

Figure 12:
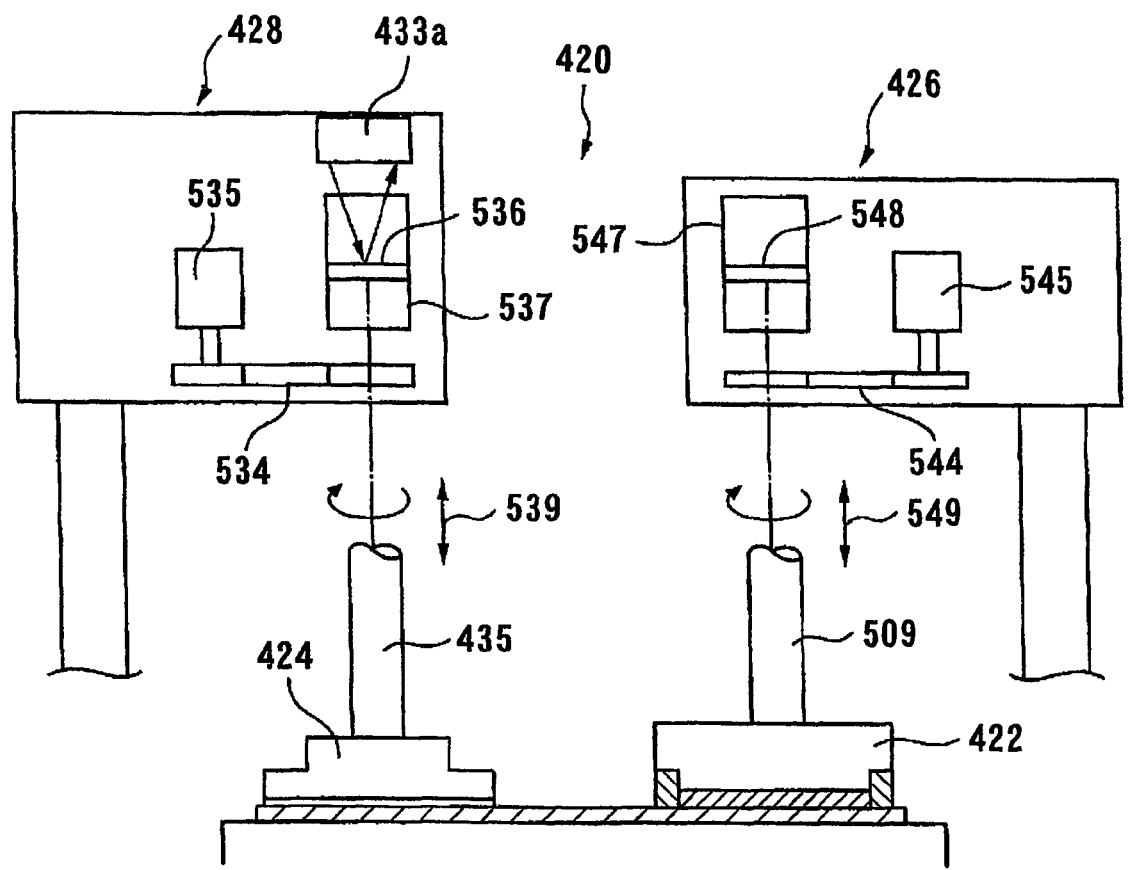
FIG. 12 is a cross-sectional view another arrangement of a pad thickness measurement device in the polishing apparatus shown in FIG. 8.

FIG. 12 is a cross-sectional view showing another arrangement of the pad thickness measurement device. As shown in FIG. 12, the dresser shaft 435 connected to the dresser 424 is coupled to a rotation motor 535 via a gear mechanism 534 so as to be rotated about an axis of the dresser shaft 435. The dresser shaft 435 is also coupled to a vertically movable piston 536 disposed in a cylinder 537 so as to be lifted and lowered as indicated by an arrow 539. The pad thickness measurement device 433a is located substantially right above the cylinder 537. A pad thickness measurement device 433a has a light source for applying light to an upper surface of the vertically movable piston 536 and a detector for detecting light reflected from the upper surface of the vertically movable piston 536. Thus, the thickness of the polishing pad can be measured by the pad thickness measurement device 433a. Specifically, the pad thickness measurement device 433a has a detector for detecting an amount of abrasion of the polishing pad by using a laser and a subtracter for the amount of abrasion of the polishing pad from an initial depth of the groove of the polishing pad to calculate the depth of the groove of the polishing pad.

The polishing apparatus shown in FIG. 12 includes a top ring unit 426 which has a similar structure to the dressing unit 428. Specifically, a top ring shaft 509 connected to the top ring 422 is coupled to a rotation motor 545 via a gear mechanism 544 so as to be rotated about an axis of the top ring shaft 509. The top ring shaft 509 is also coupled to a vertically movable piston 548 disposed in a cylinder 547 so as to be lifted and lowered as indicated by an arrow 549.

For example, a measured value D1 of the depth of the grooves of the polishing pad is substituted for the correlation function F(D) between the polishing rate and the depth of the grooves of the polishing pad, which is shown in FIG. 11A. For example, according to this substitution, the present polishing rate is calculated as being different from a polishing rate of a new polishing pad by −5 nm/min. A measured value R1 of the surface roughness of the polishing pad is substituted for the correlation function F(R) between the polishing rate and the surface roughness of the polishing pad, which is shown in FIG. 11B. According to this substitution, the present polishing rate is calculated as being different from a polishing rate of a new polishing pad by −10 nm/min. A measured value T1 of the surface temperature of the polishing pad is substituted for the correlation function F(T) between the polishing rate and the surface temperature of the polishing pad, which is shown in FIG. 11C. According to this substitution, the present polishing rate is calculated as being different from a polishing rate of a steady temperature by +2 nm/min. From these results, the present polishing rate of the polishing apparatus can be calculated as being different from a standard polishing rate by −5−10+2=−3 nm/min. The standard polishing rate is defined as a polishing rate when a new polishing pad and a new dresser are used at a steady temperature (e.g. 25° C.).

Figure 13A:
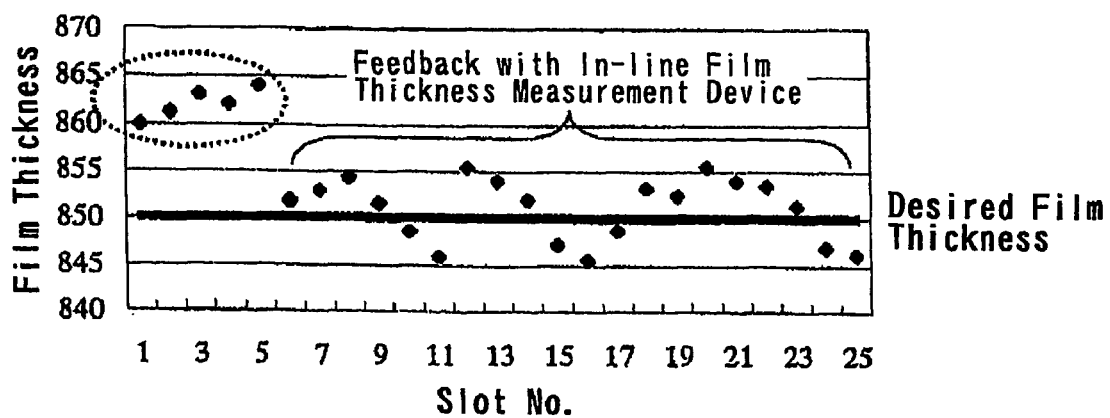
FIG. 13A is a plot showing a film thickness of polished substrates in a conventional polishing apparatus.
Figure 13B:
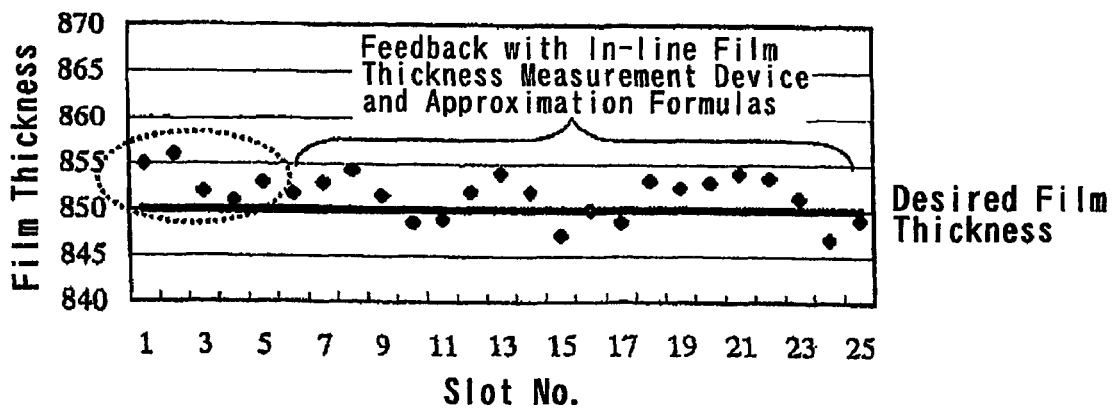
FIG. 13B is a plot showing a film thickness of polished substrates in a polishing apparatus according to the present invention.

FIGS. 13A and 13B are plots showing the film thickness of polished substrates. In FIGS. 13A and 13B, the horizontal axes represent the number of cassettes (slot No.) receiving polished substrates. The substrates specified by the slot number are polished in order from left to right in the horizontal axes. FIG. 13A shows a case of a conventional polishing apparatus, whereas FIG. 13B shows a case of a polishing apparatus according to the present invention. As shown in FIG. 13A, with the conventional polishing apparatus, the film thicknesses of the substrates of the slot numbers 1-5 deviate from a desired film thickness to a relatively large degree because a feedback by the in-line film thickness measurement device is late for modification. In FIG. 13B, the film thicknesses of the substrates of the slot numbers 1-5 are controlled by forecast using approximation formulas and are thus brought close to a desired film thickness. Specifically, in FIG. 13B, first five substrates can be processed with high accuracy in consideration of a polishing rate of −3 nm/min.

The polishing apparatus may include a measurement device for measuring at least two points on a polished substrate to detect irregularities of the polished substrate, and an alarm device to issue an alarm when the amount of the irregularities is more than a preset value. The roughness of the surface of the polishing pad may be represented by at least one of maximum peak height (Rb), maximum valley depth (Rv), maximum height (Rz), mean height (Rc), total height of profile (Rt), arithmetical mean roughness (Ra), root mean square height (Rq), skewness (Rsk), kurtosis (Rku), mean width (RSm), root mean square slope (RΔq), material ratio (Rmr(c)), profile section height difference (Rδc), relative material ratio (Rmr), and ten-point mean roughness (Rzjis). Further, the roughness of the surface of the polishing surface may be measured by a contact-type surface roughness measurement device or a non-contact-type surface roughness measurement device.

According to the present invention, conditions of the CMP apparatus can accurately be obtained. Therefore, it is not necessary to use a QC substrate. Further, principle polishing conditions including the depth of the grooves in the surface of the polishing pad, the thickness of the hard polishing pad, a state of the dressed polishing pad, the temperature of the surface of the polishing pad, and the like can accurately be obtained. Accordingly, it is possible to remarkably reduce a risk of excessively polishing substrates. According to the present invention, the depth of the grooves in the surface of the polishing pad, the thickness of the hard polishing pad, a state of the dressed polishing pad, and the temperature of the surface of the polishing pad, which would cause changes of an polishing rate or polishing characteristics, are continuously monitored so as to properly control the polishing rate or the polishing characteristics. Thus, it is possible to reduce a risk of reworking due to excessive polishing or a lowered yield.

Although certain preferred embodiments of the present invention have been shown and described in detail, it should be understood that various changes and modifications may be made therein without departing from the scope of the appended claims.

INDUSTRIAL APPLICABILITY

The present invention is suitable for use in a polishing apparatus and includes a polishing method for polishing a substrate such as a semiconductor wafer to a flat mirror finish.

The invention claimed is:

1. A polishing method comprising:
measuring a thickness of a film formed on a substrate;
inputting a desired thickness of a film formed on a substrate to be polished;
storing polishing rate data on at least two lately polished substrates in a storage device;
calculating a polishing rate and an optimal polishing time based on the polishing rate data and the desired thickness by using a weighted average method which weights the polishing rate data on the at least two lately polished substrates; and
polishing a subsequent substrate for the optimal polishing time,
wherein the weighted average method includes setting a weight coefficient for each lately polished substrate, and
wherein the weight coefficient for a most recently polished substrate of the at least two lately polished substrates is larger than the weight coefficient for a less recently polished substrate of the at least two lately polished substrates.

2. The polishing method as recited in claim 1, further comprising calibrating a measuring unit which performs said measuring at a predetermined frequency by using a calibration substrate having a known thickness of a film formed thereon.

3. The polishing method of claim 1, wherein polishing rate in the polishing rate data is calculated as film removed per unit time when polishing under a predetermined pressure.

4. The polishing method of claim 1, wherein the polishing rate data is obtained by measuring film thickness before polishing, during polishing, and after polishing of the at least two lately polished substrates.

5. The polishing method of claim 4, wherein polishing rate in the polishing rate data is calculated as film removed per unit time when polishing under a predetermined pressure.

6. A polishing method comprising:
measuring a thickness of a film formed on a substrate;
inputting a desired thickness of the film formed on the substrate;
storing polishing rate data on at least two lately polished substrates in a storage device, the at least one past substrate being recently polished;
calculating a polishing rate and an optimal polishing time based on the polishing rate data and the desired thickness of the film formed on the substrate by using a weighted average method which weights the polishing rate data on the at least two lately polished substrates; and
polishing the substrate for the optimal polishing time,
wherein the weighted average method includes setting a weight coefficient for each lately polished substrate, and
wherein the weight coefficient for a most recently polished substrate of the at least two lately polished substrates is larger than the weight coefficient for a less recently polished substrate of the at least two lately polished substrates.

7. The polishing method of claim 6, wherein polishing rate in the polishing rate data is calculated as film removed per unit time when polishing under a predetermined pressure.

8. The polishing method of claim 6,
wherein said calculating the optimal polishing time includes calculating a margin based on a variation in the polishing rate between the at least two lately polished substrates.

9. The polishing method of claim 8, wherein the margin is calculated by:

$$(\text{an amount of polishing})/(\text{average polishing rate} \times 120\%); \quad \text{(i)}$$

$$(\text{an amount of polishing})/(\text{maximum polishing rate in the past}); \quad \text{(ii)}$$

or $$(\text{an amount of polishing} \times 80\%)/(\text{average polishing rate}). \quad \text{(iii)}$$

10. The polishing method of claim 6, wherein the polishing rate data is obtained by measuring film thickness of the at least one past substrate before polishing, during polishing, and after polishing of the at least two lately polished substrates.

11. The polishing method of claim 6, wherein the at least two lately polished substrates are polished consecutively,
wherein the weight coefficient for each lately polished substrate is larger than the weight coefficient for the preceding lately polished substrate.

12. A polishing method comprising:
polishing a first substrate;
after polishing the first substrate, storing polishing rate data on the first substrate in a storage device;
after polishing the first substrate, polishing a second substrate;
after polishing the second substrate, storing polishing rate data on the second substrate in the storage device;
measuring a thickness of a film formed on a third substrate;
inputting a desired thickness of the film formed on the third substrate;
calculating a polishing rate and an optimal polishing time for the third substrate based on the polishing rate data on the first substrate, the polishing rate data on the second substrate, and the desired thickness of the film formed on the third substrate by using a weighted average method in which the polishing rate data on the second substrate is weighted more heavily than the polishing rate data on the first substrate; and
polishing the third substrate for the optimal polishing time.

13. The polishing method of claim 12, wherein the at least two lately polished substrates are polished consecutively,
wherein the weight coefficient for each lately polished substrate is larger than the weight coefficient for the preceding lately polished substrate.

14. The polishing method of claim 13, wherein optimal polishing time is calculated as $$T_o = 1/(X_0 * Z)$$

where $T_o$ is the optimal polishing time, $X_0$ is the polishing rate, and Z is the difference between the measured thickness and the desired thickness of the film formed on the third substrate.

15. The polishing method of claim 12, wherein the weighted average method is calculated as $$X_0 = (AX_1 + BX_2)/(A+B)$$

where $X_0$ is the polishing rate, $X_1$ is the polishing rate data on the first substrate, $X_2$ is the polishing rate data on the second substrate, A is a weight coefficient for the polishing rate data on the first substrate, and B is a weight coefficient for the polishing rate data on the second substrate; and
wherein B>A.

16. The polishing method of claim 15, wherein optimal polishing time is calculated as $$T_o = 1/(X_0 * Z)$$

where $T_o$ is the optimal polishing time, $X_0$ is the polishing rate, and Z is the difference between the measured thickness and the desired thickness of the film formed on the third substrate.

17. The polishing method of claim 12, wherein polishing rate in the polishing rate data on the first substrate and the polishing rate data on the second substrate is calculated as film removed per unit time when polishing under a predetermined pressure.

18. The polishing method of claim 12, wherein said calculating the optimal polishing time includes calculating a margin based on a variation in the polishing rate between the at least two lately polished substrates.

19. The polishing method of claim 18, wherein the margin is calculated by:

(an amount of polishing)/(average polishing rate× 120%); (i)

(an amount of polishing)/(maximum polishing rate in the past); (ii)

or (an amount of polishing×80%)/(average polishing rate). (iii)

* * * * *